(12) United States Patent
Sugimoto et al.

(10) Patent No.: US 7,667,976 B2
(45) Date of Patent: Feb. 23, 2010

(54) ELECTRONIC CIRCUIT DEVICE AND METHOD OF MAKING THE SAME

(75) Inventors: Keiichi Sugimoto, Kariya (JP); Mitsuru Nakagawa, Chiryu (JP)

(73) Assignee: Denso Corporation, Kariya (JP)

( * ) Notice: Subject to any disclaimer, the term of this patent is extended or adjusted under 35 U.S.C. 154(b) by 4 days.

(21) Appl. No.: 12/243,243

(22) Filed: Oct. 1, 2008

(65) Prior Publication Data
US 2009/0086447 A1 Apr. 2, 2009

(30) Foreign Application Priority Data
Oct. 1, 2007 (JP) .............................. 2007-257842

(51) Int. Cl.
*H05K 13/04* (2006.01)
(52) U.S. Cl. .................. 361/760; 361/737; 361/764; 174/260; 29/841; 257/678; 257/787
(58) Field of Classification Search ........... 361/737, 361/760, 764; 174/521; 235/492; 257/678, 257/687, 787; 29/830, 841, 855
See application file for complete search history.

(56) References Cited

U.S. PATENT DOCUMENTS

| | | | | |
|---|---|---|---|---|
| 5,354,205 | A * | 10/1994 | Feigenbaum et al. | 439/67 |
| 6,177,636 | B1 * | 1/2001 | Fjelstad | 174/267 |
| 6,282,781 | B1 | 9/2001 | Gotoh et al. | |
| 6,285,086 | B1 | 9/2001 | Sota et al. | |
| 6,826,827 | B1 * | 12/2004 | Fjelstad | 29/830 |
| 6,849,806 | B2 * | 2/2005 | Abbott et al. | 174/260 |
| 7,138,299 | B2 * | 11/2006 | Fjelstad | 438/118 |
| 7,368,666 | B2 * | 5/2008 | Takeda | 174/260 |
| 7,375,975 | B1 * | 5/2008 | Jang et al. | 361/752 |
| 7,474,008 | B2 * | 1/2009 | Fukuta et al. | 257/787 |
| 7,491,893 | B2 * | 2/2009 | Takesue | 174/260 |
| 7,495,179 | B2 * | 2/2009 | Kubota et al. | 174/260 |
| 2006/0252384 | A1 | 11/2006 | Sugimoto et al. | |
| 2007/0161269 | A1 | 7/2007 | Sugimoto et al. | |

FOREIGN PATENT DOCUMENTS

| | | |
|---|---|---|
| JP | 11-20358 | 1/1999 |
| JP | 11-145339 | 5/1999 |

OTHER PUBLICATIONS

U.S. Appl. No. 12/243,189, of Sugimoto et al. filed Oct. 1, 2008.
U.S. Appl. No. 12/243,217, of Sugimoto et al. filed Oct. 1, 2008.

\* cited by examiner

*Primary Examiner*—Dameon E Levi
(74) *Attorney, Agent, or Firm*—Nixon & Vanderhye P.C.

(57) ABSTRACT

A method of making an electronic circuit device includes preparing an electronic element having at least one projection, mounting the electronic element on only a first side of a circuit board in such a manner that the projection is substantially held in point contact with the first side of the circuit board to form a gap between the circuit board and the electronic element, placing the circuit board in a mold cavity in such a manner that a second side of the circuit board is held in close contact with an inner surface of the cavity. The method further includes encapsulating the circuit board in a casing by filling the cavity with a resin material so that the gap is filled with the resin material.

10 Claims, 4 Drawing Sheets

ELECTRONIC CIRCUIT DEVICE AND METHOD OF MAKING THE SAME

CROSS REFERENCE TO RELATED APPLICATION

This application is based on and incorporates herein by reference Japanese Patent Application No. 2007-257842 filed on Oct. 1, 2007.

FIELD OF THE INVENTION

The present invention relates to an electronic circuit device and method of making the electronic circuit device.

BACKGROUND OF THE INVENTION

US 2007/0161269 corresponding to JP-A-2006-303327 discloses an electronic circuit device configured as an electronic key transceiver. The electronic circuit device includes a circuit board having first and second sides opposite each other Electronic elements are mounted on only the first side of the circuit board. The circuit board is encapsulated in a casing in such a manner that the second side of the circuit board is exposed to an outer surface of the casing. Thus, the second side of the circuit board defines part of the outer surface of the casing.

A method of making the electronic circuit device includes a placing process and an encapsulating process subsequent to the placing process. In the placing process, the circuit board is placed in a cavity of a mold (i.e., die) in such a manner that the second side of the circuit board can be held in close contact with an inner surface of the cavity. In the encapsulating process, a liquid resin material is injected under pressure into the cavity of the mold and then cured (i.e., solidified).

Since the circuit board is held in close contact with the inner surface of the cavity, the circuit board can be prevented from being greatly deformed by pressure and heat, which are applied to the circuit board in the encapsulating process.

In the method described above, after the resin material is injected to the cavity, air may be trapped in a gap between the electronic element and the circuit board. The air trapped in the gap may expand due to the pressure and heat and cause a bulge (bump or the like) on the second side of the circuit board. Since the second side of the circuit board is exposed to the outer surface of the casing, the bulge mars the appearance of the electronic key transceiver.

SUMMARY OF THE INVENTION

In view of the above-described problem, it is an object of the present invention to provide an electronic circuit device and method of making the electronic circuit device to prevent a bulge from appearing on an exposed surface of a circuit board.

According to an aspect of the present invention, a method of making an electronic circuit device includes preparing an electronic element having a projection, mounting the electronic element on only a first side of a circuit board in such a manner that the projection is substantially held in point contact with the first side of the circuit board to form a gap between the circuit board and the electronic element, and placing the circuit board in a cavity of a mold in such a manner that a second side of the circuit board is held in close contact with an inner surface of the cavity. The second side is opposite to the first side. The method further includes encapsulating the circuit board and the electronic element in a casing by filling the cavity with a resin material so that the gap is filled with the resin material. The second side of the circuit board is exposed to an outer surface of the casing to define part of the outer surface of the casing.

According to another aspect of the present invention, an electronic circuit device includes a circuit board having first and second sides opposite each other, an electronic element having a projection and mounted on only the first side of the circuit board in such a manner that the projection is substantially held in point contact with the first side of the circuit board to form a gap between the circuit board and the electronic element, a resin casing configured to encapsulate the circuit board and the electronic element. The second side of the circuit board is exposed to an outer surface of the casing to define part of the outer surface of the casing. The gap is filled with a portion of the casing.

BRIEF DESCRIPTION OF THE DRAWINGS

The above and other objectives, features and advantages of the present invention will become more apparent from the following detailed description made with check to the accompanying drawings. In the drawings.

DETAILED DESCRIPTION OF THE PREFERRED EMBODIMENTS

Figure 3:
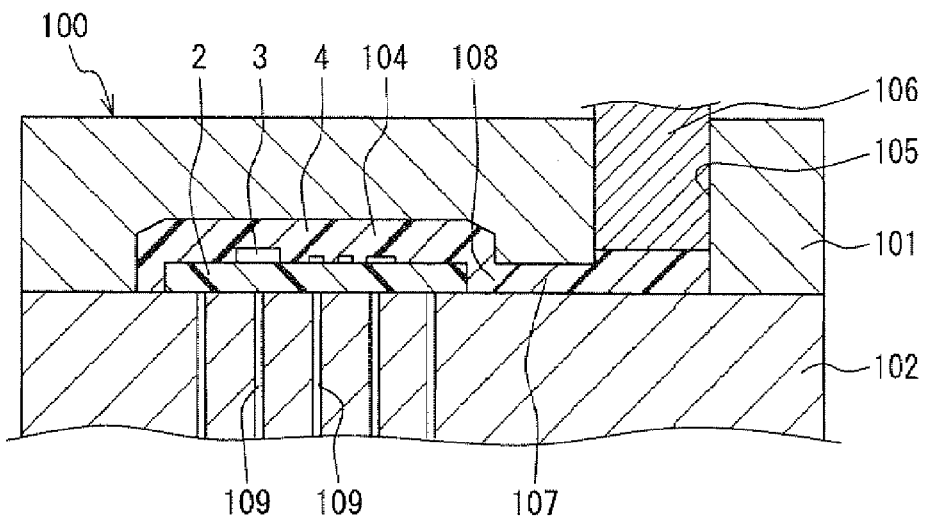
FIG. 3 is a diagram illustrating a cross-sectional view of an encapsulating process of the method of making the electronic key transceiver.
Figure 4:
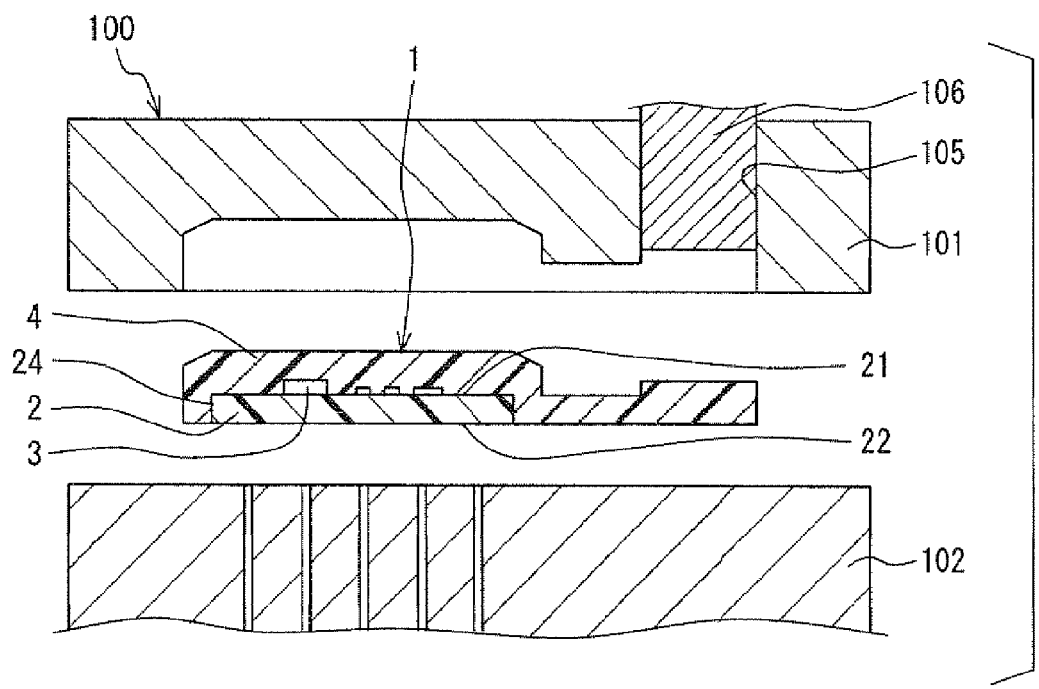
FIG. 4 is a diagram illustrating a cross-sectional view of a removing process of the method of making the electronic key transceiver.
Figure 5:
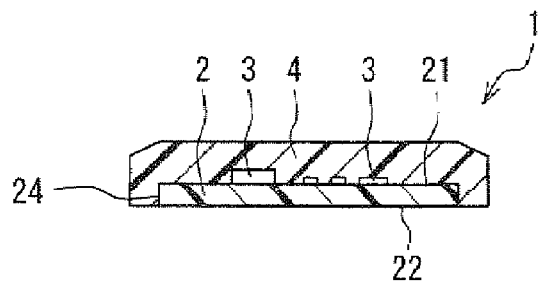
FIG. 5 is a diagram illustrating a cross-sectional view of the electronic key transceiver.

An electronic key transceiver 1 according to an embodiment of the present invention is described below with reference to FIGS. 1-6B. FIG. 5 illustrates the electronic key transceiver 1 as a finished product. The electronic key transceiver 1 includes a circuit board 2, an electronic element 3 mounted on the circuit board 2, and a casing 4 made of a resin material. For example, the electronic key transceiver 1 can be used in a vehicle electronic key system and designed to be carried by a driver.

Figure 1:
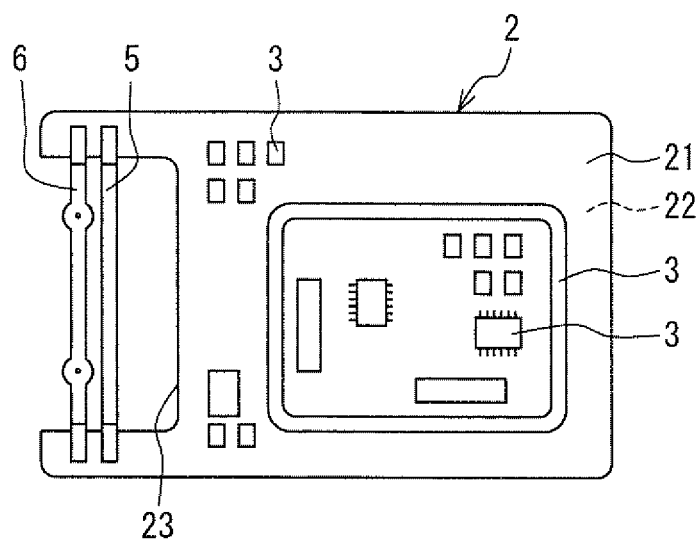
FIG. 1 is a diagram illustrating a top view of a circuit board of an electronic key transceiver according to an embodiment of the present invention.

As illustrated in detail in FIG. 1, positive and negative terminals 5, 6 are soldered to the circuit board 2. The circuit board 2, the electronic element 3, and solder joints between each of the positive and negative terminals 5, 6 and the circuit board 2 are encapsulated in the casing 4.

The circuit board 2 can be made, for example, by forming an electrical conductor trace pattern (e.g., copper foil) to an electrical insulator base such as a glass epoxy board. In the embodiment, the circuit board 2 employs a glass-reinforced epoxy board as the base. Alternatively, the base of the circuit board can be a board other than a glass-reinforced epoxy board.

The circuit board 2 has first and second sides 21, 22 opposite each other. The electronic element 3 is mounted on only the first side 21 of the circuit board 2 so that the second side 22 of the circuit board 2 can be flat. An example of the electronic element 3 can be a resistor, a capacitor, a diode, a transistor, an integrated circuit (IC) module, an antenna, or the like.

The circuit board 2 has a cutout 23 that defines a battery space where a battery (not shown) is accommodated. For example, the battery can be a button-type battery. The positive terminal 5 spans the cutout 23 and is soldered to the trace pattern of the circuit board 2 at each end. Likewise, the negative terminal 6 spans the cutout 23 and is soldered to the trace pattern of the circuit board 2 at each end. When the battery is accommodated in the battery space, positive and negative poles of the battery are in contact with the positive and negative terminals 5, 6, respectively. Thus, the electronic key transceiver 1 can be powered by the battery accommodated in the battery space.

Figure 2:
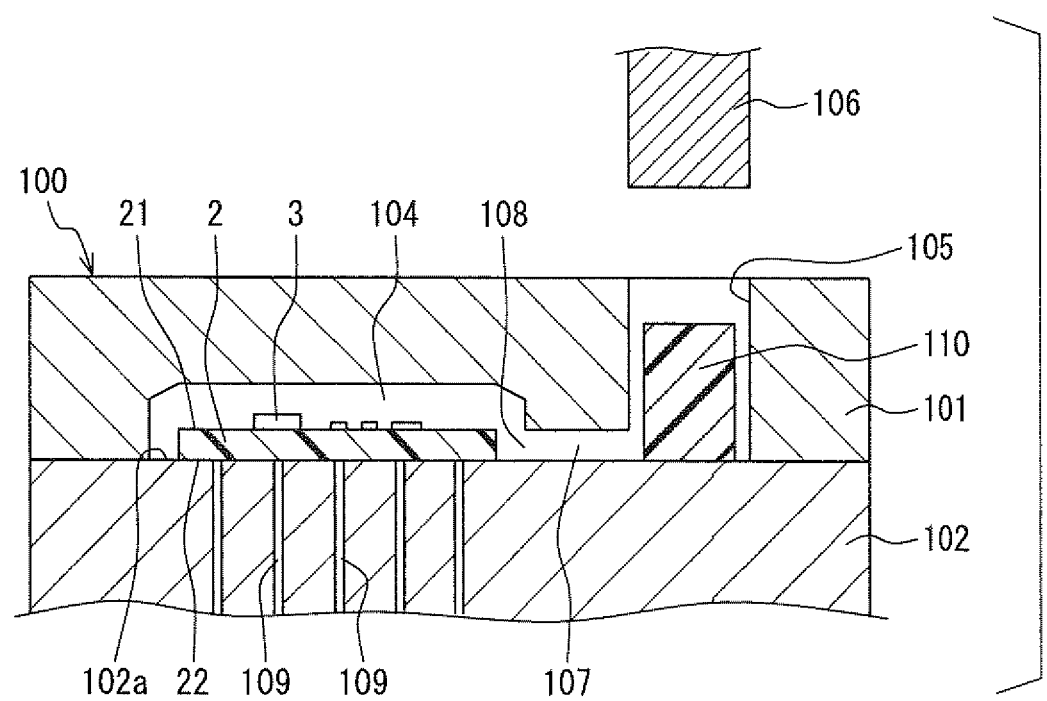
FIG. 2 is a diagram illustrating a cross-sectional view of a placing process of a method of making the electronic key transceiver.

The casing 4 of the electronic key transceiver 1 is made by using a mold 100 (i.e., a die) illustrated in FIG. 2. The circuit board 2, to which the electronic element 3 and the positive and negative terminals 5, 6 are mounded, is placed in a cavity 104 of the mold 100 in such a manner that the second side 22 of the circuit board 2 can be held in close contact with an inner surface of the cavity 104.

The mold 100 includes an upper mold 101, a lower mold 102, and a slide core (not shown). The slide core is sometimes also referred as a "side core". The slide core covers middle portions of the positive and negative terminals 5, 6 to form the battery space. The upper and lower molds 101, 102 are fixed to movable or fixed platens of a molding machine (not shown).

The upper mold 101 of the mold 100 has a sprue (i.e., runner) 107. A pot 105 is located on an upstream side of the sprue 107, and a gate 108 is located on a downstream side of the sprue 107. A plunger 106 (i.e., piston) of the molding machine is located above the pot 105 so that the plunger 106 can enter and exit the pot 105. A tablet 110 as a solid resin material is charged into the pot 105, and then the plunger 106 enters the pot 105. As a result, the tablet 110 can change to a liquid resin material. The liquid resin material flows from the pot 105 to the cavity 104 by passing through the sprue 107 and the gate 108.

The lower mold 102 of the mold 100 has a suction hole 109 exposed to a surface 102a. The suction hole 109 is coupled through a pipe (not shown) to an external suction source (not shown) such as a vacuum pump.

A method of making the electronic key transceiver 1 is described below with reference to FIGS. 2-6B. The method includes a gap forming process illustrated in FIGS. 6A and 6B, a placing process subsequent to the forming process and illustrated in FIG. 2, an encapsulating process subsequent to the placing process and illustrated in FIG. 3, and a removing process subsequent to the encapsulating process and illustrated in FIG. 4.

Firstly, the placing process is described below with reference to FIG. 2. In the placing process, the second side 22 of the circuit board 2 is placed on the surface 102a of the lower mold 102 so that the circuit board 2 can be located on the suction hole 109. Then, the upper mold 101 and the lower mold 102 are assembled and clamped together to form the cavity 104. As a result, the circuit board 2 is located in the cavity 104 of the mold 100. At this time, the suction hole 109 is maintained at negative pressure by the suction source with respect to the cavity 104 so that the second side 22 of the circuit board 2 can be held in close contact with the inner surface of the cavity 104.

Then, the tablet 110 as the resin material for the casing 4 is charged into the pot 105 of the mold 100.

The tablet 110 can be made of thermoset resin. In the embodiment, the tablet 110 is made of epoxy resin. For example, B-stage (i.e., semi-cured) epoxy resin powder is compressed into the tablet 110. The use of the tablet 110 (i.e., the use of solid material instead of liquid material) can improve manufacturability of the electronic key transceiver 1 and also help prevent air bubble from being trapped in the casing 4 of the electronic key transceiver 1. If necessary, the tablet 110 can be preheated before being charged into the pot 105.

A temperature of the mold 100 needs to be adjusted to cause a curing reaction of the epoxy resin. Further, since the electronic element 3 and the positive and negative terminals 5, 6 are joined to the circuit board 2 by solder, the temperature of the mold 100 needs to be less than a melting temperature of the solder. In the embodiment, the solder has a melting temperature of about 240° C., and the epoxy resin has a curing reaction temperature of about 170° C. Therefore, for example, the temperature of the mold 100 can be set to about 200° C.

As describe above, the casing 4 of the electronic key transceiver 1 is made of the epoxy resin. Since the epoxy resin has high heat resistance and high mechanical resistance, the electronic key transceiver 1 can be suitably protected against damage. Therefore, although the electronic key transceiver 1 is carried by the driver at all times, a reliability of the electronic key transceiver 1 can be ensured.

The resin material for the casing 4 of the electronic key transceiver 1 can be a resin material other than epoxy resin, as long as a curing reaction temperature of the resin material is less than a melting temperature of the solder. For example, the resin material can be phenolic resin, unsaturated polyester resin, or the like.

Next, the encapsulating process subsequent to the placing process is described below with reference to FIG. 3. In the encapsulating process, the plunger 106 moves down and enters the pot 105 so that the tablet 110 in the pot 105 can change to a liquid epoxy resin. The liquid epoxy resin is injected to the cavity 104 through the sprue 107 and the gate 108 so that the cavity 104 can be filled with the liquid epoxy resin. The liquid epoxy resin in the cavity 104 receives heat from the mold 100. The heat causes a curing reaction of the liquid epoxy resin. As a result, the liquid epoxy resin is cured and molded into the casing 4. In this way, the circuit board 2 is encapsulated in the casing 4, which is made of the epoxy resin.

Next, the removing process subsequent to the encapsulating process is described below with reference to FIG. 4. In the removing process, the mold 100 is opened, and the circuit board 2 encapsulated in the casing 4 is removed from the mold 100 by using an eject mechanism (not shown) of the molding machine. Then, the casing 4 is cut along the gate 108 to eliminate an unnecessary portion corresponding to the pot 105 and the sprue 107. In this way, the electronic key transceiver 1 shown in FIG. 5 can be made. Since the second side 22 of the circuit board 2 is held in close contact with the inner surface of the cavity 104 during the encapsulating process, the second side 22 of the circuit board 2 is exposed to an outer surface of the casing 4 as shown in FIG. 5.

If necessary, a surface treatment such as painting (coating) is applied to an outer surface of the electronic key transceiver 1. In such an approach, an exposed surface (i.e., second side 22) of the circuit board 2 is painted so that the electronic key transceiver 1 can have a good appearance.

The casing 4 encapsulates the electronic element 3 mounted on the circuit board 2, the first side 21 and a side surface 24 of the circuit board 2, and the solder joints between each of the positive and negative terminals 5, 6 and the circuit board 2. Therefore, circuitry of the electronic key transceiver 1 can be sealed in the casing 4 so that the electronic key transceiver 1 can be made waterproof.

The second side 22 of the circuit board 2 is exposed to the outer surface of the casing 4 and forms a flat continuous surface in conjunction with the outer surface of the casing 4. Thus, the second side 22 of the circuit board 2 defines part of the outer surface of the casing 4.

In the embodiment, the electronic key transceiver 1 has a rectangular shape like a card. For example, the electronic key transceiver 1 can be sized to substantially meet an ID-1 format (85.60×53.98 mm) except for a thickness. The ID-1 format is commonly used for a credit card, a bank card, or the like.

Finally, the gap forming process performed prior to the placing process is described below with reference to FIG. 6A. The gap forming process includes a preparing process and a mounting process. In the preparing process, the electronic element 3 is prepared. In the mounting process, the prepared electronic element 3 is mounted on the circuit board 2.

Figure 6A:
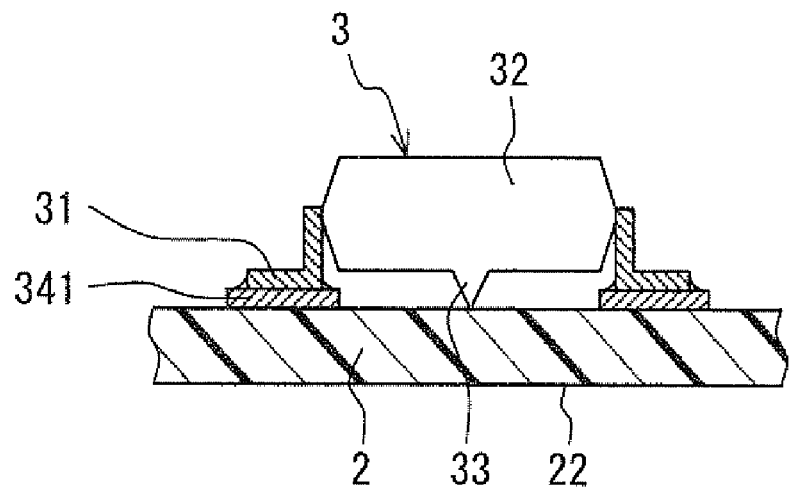
FIG. 6A is a diagram illustrating a cross-sectional view of a gap forming process of the method of making the electronic key transceiver the electronic key transceiver.

As shown in FIG. 6A, the electronic element 3 includes a housing 32 and a lead terminal 31. For example, the housing 32 can be made of epoxy resin, liquid crystal polymer, or the like. The housing 32 has a projection 33 integrally formed with the housing 32. In the embodiment, the projection 33 has a conical shape. That is, the projection 33 has a circular base joined to a vertex by a curved surface. The vertex of the projection 33 is located further away from the housing 32 than the base of the projection 33.

The electronic element 3 is mounted on the circuit board 2 by electrically connecting the lead terminal 31 to a land 341 joined to the trace pattern of the circuit board 2 through solder or the like. Further, the electronic element 3 is mounted on the circuit board 2 in such a manner that the vertex of the projection 33 of the housing 32 can be held in contact with the first side 21 of the circuit board 2. That is, the projection 33 of the electronic element 3 is held in substantially point contact with the first side 21 of the circuit board 2.

The "substantially point contact" can mean that the vertex of the projection 33 of the housing 32 can have a tiny plane portion so that a contact area between the projection 33 and the circuit board 2 can be very small.

Since the vertex of the projection 33 of the electronic element 3 is in contact with the circuit board 2, a gap can be formed between the circuit board 2 and the electronic element 3. The width of the gap is determined by the length of the projection 33. The length of the projection 33 is a distance between the vertex and the base. The length of the projection 33 is adjusted such that the liquid resin material injected to the cavity 104 in the encapsulating process can enter and fill the gap.

If the length of the projection 33 is less than 0.1 millimeters, the gap is too narrow for the liquid resin material to enter and fill the gap. If the length of the projection 33 is greater than 0.3 millimeters, the liquid resin material can smoothly enter and fill the gap. However, as the length of the projection 33 is greater, the size of the electronic key transceiver 1 becomes larger. Therefore, it is preferable that the length of the projection 33 be from 0.1 millimeters to 0.3 millimeters. In the embodiment, the length of the projection 33 is set to 0.2 millimeters.

Figure 6B:
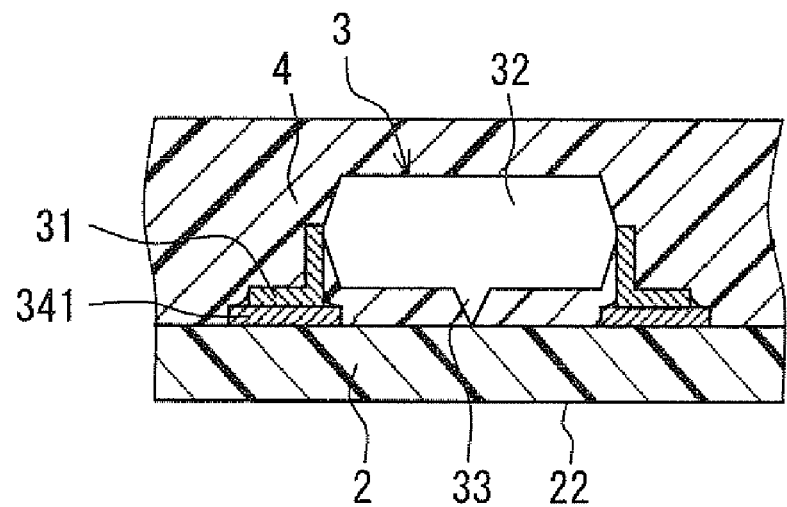
FIG. 6B is a diagram illustrating a cross-sectional view of an electronic element encapsulated in a casing of the electronic key transceiver.

By performing the gap forming process prior to the encapsulating process, the gap between the circuit board 2 and the electronic element 3 can be filled with the liquid resin material, which is injected to the cavity 104 during the encapsulating process. That is, as shown in FIG. 6B, a portion of the casing 4 fills the gap between the circuit board 2 and the electronic element 3 to expel air from the gap.

When a vertex angle of the projection 33 is large, the liquid resin material may not reach the vertex of the projection 33, and air may be left around the vertex of the projection 33. Therefore, to fully fill the gap with the liquid resin material, it is preferable that the vertex angle of the projection 33 be as small as possible. In other words, to fully fill the gap with the liquid resin material, it is preferable that a ratio of the length of the projection 33 with respect to a diameter of the base of the projection 33 be as large as possible.

However, if the ratio of the length of the projection 33 with respect to the diameter of the base of the projection 33 is too large, the projection 33 may be deformed due to external force such as pressure applied in the encapsulating process. Therefore, in the embodiment, the length of the projection 33 is set equal to the diameter of the base of the projection 33.

The projection 33 can have a shape other than a right conical shape. For example, a generatrix of the conical shape can be curved inwardly or outwardly.

As described above, according to the embodiment, the gap forming process is performed prior to the encapsulating process. In the gap forming process, the electronic element 3 having the projection 33 is prepared. The electronic element 3 is mounted on the circuit board 2 in such a manner that the vertex of the projection 33 can be held in contact with the circuit board 2. In such an approach, the projection 33 of the electronic element 3 is substantially held in point contact with the circuit board 2 so that the gap can be formed between the circuit board 2 and the electronic element 3. Thus, the portion of the casing 4 fills the gap between the circuit board 2 and the electronic element 3 so that air can be expelled from the gap.

According to the embodiment, the projection 33 is shaped like a cone, and only the vertex of the projection 33 is in contact with the circuit board 2. In such an approach, the resin material can reach near the vertex of the projection 33 so that air can be surely expelled from the gap between the circuit board 2 and the electronic element 3.

Even if air is left in the gap near the vertex of the projection 33, the amount of the air left in the gap is very small. Further, the air is likely to expand in a direction parallel to the circuit board 2 because of the conical shape of the projection 33. Therefore, stress applied by the expand air to the circuit board 2 can be reduced.

In this way, the gap between the circuit board 2 and the electronic element 3 is filled with the portion of the casing 4 during the encapsulating process. Therefore, air is expelled from the gap so that stress applied by the air to the circuit board 2 can be prevented. Thus, the exposed surface (i.e., second side 22) of the circuit board 2 can have no blister so that the electronic key transceiver 1 can have good appearance.

The projection 33 has a conical shape, which is a relatively simple shape. Therefore, the projection 33 can be easily formed integrally with the housing 32 of the electronic element 3.

The second side 22 of the circuit board 2 defines the part of the outer surface of the casing 4. In such an approach, the thickness of the electronic key transceiver 1 can be reduced.

The circuit board 2 employs the glass-reinforced epoxy board as the base. In such an approach, the electronic key transceiver 1 can have both stiffness and toughness.

Figure 7:
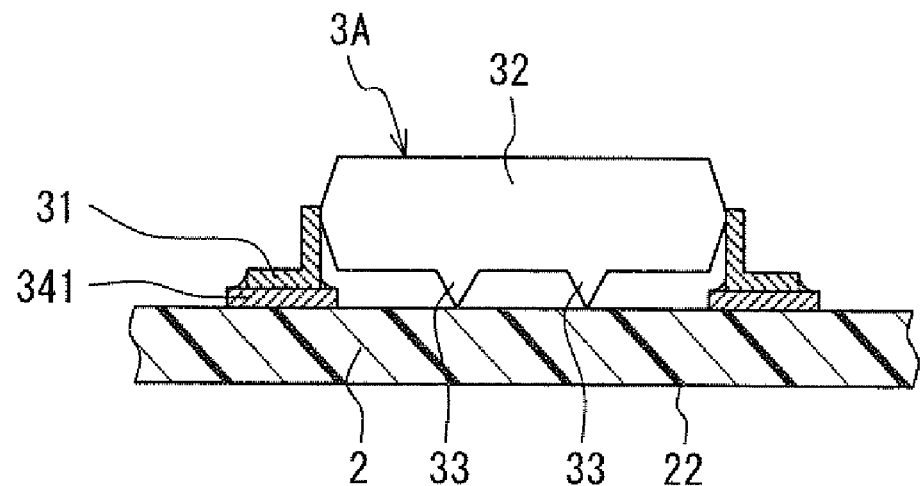
FIG. 7 is a diagram illustrating a cross-sectional view of an electronic element of an electronic key transceiver according to a modification of the embodiment.

The embodiment described above can be modified in various ways. For example, as shown in FIG. 7, an electronic element 3A can have multiple projections 33. The projections 33 can be arranged in a predetermined pattern. For example, the projections 33 can be arranged in a matrix. It is preferable that the projections 33 are arranged at a regular interval. In such an approach, force applied to vertexes of the projections 33 can be equally distributed so that deformations of the vertexes of the projections 33 can be prevented in the encapsulating process. Thus, a gap between the circuit board 2 and the electronic element 3A can be filled with the resin material in the encapsulating process.

Figure 8:
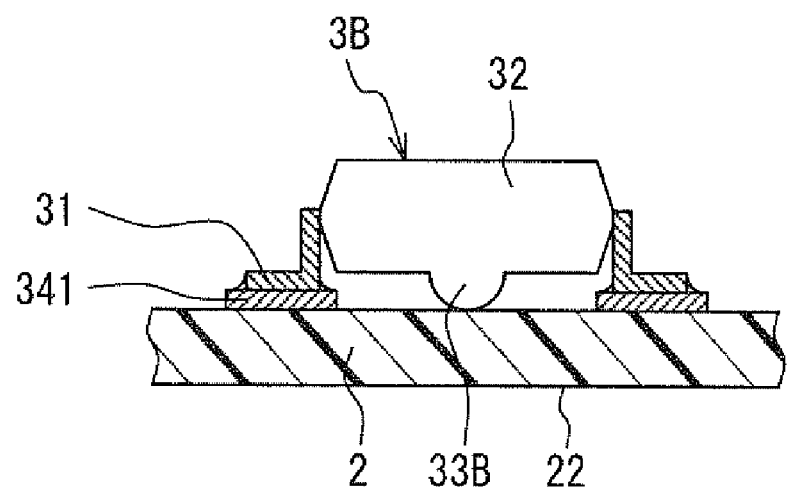
FIG. 8 is a diagram illustrating a cross-sectional view of an electronic element of an electronic key transceiver according to another modification of the embodiment.

The projection 33 can have a shape other than a conical shape. For example, as shown in FIG. 8, an electronic element 3B can have a projection 33 having a hemispherical shape.

The electronic elements 3, 3A, 3B can be an element other than a dual in-line package (DIP) element. For example, the electronic elements 3, 3A, 3B can be a single in-line package (SIP) element, a surface-mounted package element, or the like.

The casing 4 can be made by using a molding technique other than a transfer molding technique. For example, the casing 4 can be made by using an injection molding technique, a compression molding technique, or the like.

The electronic key transceiver 1 (i.e., the casing 4) can have a shape other than a card. The present invention can be applied to an electronic circuit device other than an electronic key transceiver.

Such changes and modifications are to be understood as being within the scope of the present invention as defined by the appended claims.

What is claimed is:

1. A method of making an electronic circuit device comprising:
   preparing an electronic element including a housing and at least one lead terminal, the housing having at least one projection projecting therefrom remote from the at least one lead terminal;
   mounting the electronic element on only a first side of a circuit board in such a manner that the at least one projection is substantially held in point contact with the first side of the circuit board to form a gap between the circuit board and the housing of the electronic element;
   placing the circuit board in a cavity of a mold in such a manner that a second side of the circuit board is held in close contact with an inner surface of the cavity, the second side being opposite to the first side; and
   encapsulating the circuit board and the electronic element in a casing by filling the cavity with a resin material so that the gap is filled with the resin material, wherein the second side of the circuit board is exposed to an outer surface of the casing to define part of the outer surface of the casing, wherein the projection projecting from the housing of the electronic element has a substantially conical shape, or, a substantially hemispherical shape, and wherein a vertex of the projection is held in contact with the first side of the circuit board.

2. The method according to claim 1,
wherein the at least one projection comprises a plurality of projections that are arranged substantially at a regular interval.

3. The method according to claim 1,
wherein the casing has a substantially card shape.

4. An electronic circuit device comprising:
a circuit board having first and second sides opposite each other;
an electronic element including a housing and at least one lead terminal, the housing having at least one projection projecting therefrom, the electronic element mounted on only the first side of the circuit board in such a manner that the at least one projection is substantially held in point contact with the first side of the circuit board to form a gap between the circuit board and the housing of the electronic element; and
a resin casing configured to encapsulate the circuit board and the electronic element, wherein the second side of the circuit board is exposed to an outer surface of the casing to define part of the outer surface of the casing, and
wherein the gap is filled with a portion of the casing, wherein the projection projecting from the housing of the electronic element has a substantially conical shape, or, a substantially hemispherical shape, and wherein a vertex of the projection is held in contact with the first side of the circuit board.

5. The electronic circuit device according to claim 4,
wherein the at least one projection comprises a plurality of projections that are arranged substantially at a regular interval.

6. The electronic circuit device according to claim 4,
wherein the casing has a substantially card shape.

7. The method according to claim 1,
wherein the at least one projection is disposed vertically between the housing of the electronic element and the circuit board.

8. The method according to claim 1,
wherein said step of preparing the electronic element includes forming the housing and the at least one projection integrally as a single piece from a polymeric material.

9. The electronic circuit device according to claim 4,
wherein the at least one projection is disposed vertically between the housing of the electronic element and the circuit board.

10. The electronic circuit device according to claim 4,
wherein the at least one projection and the housing are integrally formed as a single piece from a polymeric material.

* * * * *